United States Patent
Ma et al.

(10) Patent No.: US 8,259,500 B2
(45) Date of Patent: *Sep. 4, 2012

(54) NON VOLATILE MEMORY CIRCUIT WITH TAILORED RELIABILITY

(75) Inventors: Yanjun Ma, Bellevue, WA (US); Steven I. Mozsgai, Fallbrook, CA (US)

(73) Assignee: Synopsys, Inc., Mountain View, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/034,608

(22) Filed: Feb. 24, 2011

(65) Prior Publication Data

US 2011/0147469 A1    Jun. 23, 2011

Related U.S. Application Data

(63) Continuation of application No. 12/114,574, filed on May 2, 2008, now Pat. No. 7,920,423.

(60) Provisional application No. 60/962,687, filed on Jul. 31, 2007.

(51) Int. Cl.
   *G11C 16/04* (2006.01)
(52) U.S. Cl. .......... 365/185.11; 365/185.04; 365/185.18
(58) Field of Classification Search ............. 365/185.11, 365/185.04, 185.18
   See application file for complete search history.

(56) References Cited

U.S. PATENT DOCUMENTS

| 7,032,064 B2 * | 4/2006 | Barnett et al. ............... 711/103 |
| 7,920,423 B1 * | 4/2011 | Ma et al. .................. 365/185.11 |
| 2006/0071793 A1 * | 4/2006 | Pesavento ................. 340/572.1 |
| 2008/0054331 A1 * | 3/2008 | Chen et al. .................... 257/315 |

OTHER PUBLICATIONS

Degraeve, R. et al., "Analytical Model for Failure Rate Prediction Due to Anomalous Charge Loss of Flash Memories," IEEE, International Electron Devices Meeting, IEDM Technical Digest, 2001, pp. 32.1.1-32.1.4.

Hu, C., "Gate Oxide Scaling Limits and Projection," IEEE, International Electron Devices Meeting, 1996, pp. 319-322.

* cited by examiner

*Primary Examiner* — Huan Hoang
(74) *Attorney, Agent, or Firm* — Fenwick & West LLP

(57) ABSTRACT

A non-volatile memory (NVM) circuit is provided, that includes at least a first and second NVM sub-array. The first sub-array is built from first memory cells. The second NVM sub-array is built from second memory cells that are constructed differently from the first memory cells. The NVM sub-arrays share a support circuit. In some embodiments the sub-arrays can be constructed, so that they exhibit different characteristics tailored to their intended use. For example one sub-array might be tailored for data retention, while the next sub-array for programming endurance, still another for write disturb immunity.

18 Claims, 11 Drawing Sheets

*MEMORY CIRCUIT INCORPORATING MULTIPLE CELL TYPES FOR TAILORED RELIABILITY*

MEMORY CIRCUIT INCORPORATING MULTIPLE
CELL TYPES FOR TAILORED RELIABILITY

323 ⟶

| 352A | 353A | 354A |
|---|---|---|
| PROGRAMMING TRANSISTOR 1 | FLOATING GATE 1 | READ-OUT TRANSISTOR 1 |

*SIMPLIFIED BLOCK DIAGRAM OF MEMORY CELL #1*

| 352B | 353B | 354B |
|---|---|---|
| PROGRAMMING TRANSISTOR 2 | FLOATING GATE 2 | READ-OUT TRANSISTOR 2 |

*SIMPLIFIED BLOCK DIAGRAM OF MEMORY CELL #2*

FIG. 3B

*MEMORY CIRCUIT INCORPORATING MULTIPLE CELL TYPES FOR TAILORED RELIABILITY*

*CROSS SECTION OF A PMOS TUNNELING DEVICE*

*CROSS SECTION OF A PMOS TUNNELING DEVICE WITH N+ POLY GATE*

*REGULAR NVM CELL # 1*

*NVM CELL # 2 WITH N+ POLY GATE*

*REGULAR NVM CELL # 3 WITH MODIFIED COUPLING RATIO*

*NVM CELL # 4 WITH N+ POLY GATE AND MODIFIED COUPLING RATIO*

CELL # 1

| RELIABILITY CHARACTERISTICS | FIGURE OF MERIT |
|---|---|
| RETENTION | 1 |
| DISTURB | 1 |
| ENDURANCE | 3 |

HARDEST TO PROGRAM, RETENTION IS GOOD DUE TO P+ POLY

CELL # 2

| RELIABILITY CHARACTERISTICS | FIGURE OF MERIT |
|---|---|
| RETENTION | 3 |
| DISTURB | 3 |
| ENDURANCE | 1 |

HAS THE BEST ENDURANCE DUE TO N+ POLY, LESS STRESS THAN C4

ITUN V. VTUN FOR TUNNELING DEVICES FOR
NVM CELLS WITH DIFFERENT COUPLING RATIOS

NON VOLATILE MEMORY CIRCUIT WITH TAILORED RELIABILITY

CROSS-REFERENCE TO RELATED APPLICATIONS

This application is a continuation of U.S. patent application Ser. No. 12/114,574, filed May 2, 2008, which claims the benefit of U.S. Provisional Patent Application No. 60/962,687, filed Jul. 31, 2007, which are incorporated by reference herein in their entirety.

FIELD

The present description is related to the field of non-volatile memory (NVM), and more specifically, to NVM having multiple sub-arrays with different properties.

BACKGROUND

Memory devices are electronic devices arranged to store data. Memory elements can be combined in various arrangements in order to store multiple bits arranged in words or other combinations. Various electronic circuits, including semiconductor devices, such as, transistors are used as memory elements.

Memory elements may be classified in two main categories: volatile and nonvolatile. Volatile memory loses any data as soon as the system is turned off, thus, it requires constant power to remain viable. Most types of random access memories (RAM) fall into this category. Non-volatile memory does not lose its data when the system or device is turned off.

Demand for embedded nonvolatile memory (NVM) in integrated circuits has grown steadily over the past decade. Desirable characteristics of embedded NVM include low cost, low power, high speed, and high reliability (data retention and program/erase cycling endurance). NVM may be embedded in various integrated circuit (IC) technologies, for example, in the widely used Complementary Metal Oxide Semiconductor (CMOS) technology.

NVM is used to store serial number information, security information, settings, parameters, computer instructions (firmware), and the like. Radio Frequency IDentification (RFID) tags are an important field of application for reprogrammable NVMs since they store information inexpensively and reliably.

As NVM is pushed to the limit of its performance, problems emerge. These include data retention, program endurance, and write disturb. Often a memory has various portions that are used for different purposes. There typically is a portion for code storage where the content is changed very infrequently. There is also typically a user memory portion where the content is changed more often. In some instances, this was addressed by having two separate NVM arrays, each independently controlled, with different characteristics. This did not work, however, where silicon real estate was preciously low, such as in RFID tags. There, there are sections for storing such info as fabrication specific information, Electronic Article Surveillance (EAS), and Tag IDentification (TID) information that do not change or change infrequently. There are also sections i.e. user memory and memory for EPC segments that might be changed frequently. These, however, a single array is used because of space and power constraints.

The disclosure addresses this shortcoming of prior art by introducing a novel memory circuit architecture. The memory circuit architecture partitions a memory array into sub-arrays to take advantage of different memory use models.

SUMMARY

The present disclosure provides a Non-Volatile Memory (NVM) circuit. The NVM includes at least a first and second NVM sub-arrays. The first sub-array is built from first memory cells. The second NVM sub-array is built from second memory cells that are constructed differently from the first memory cells. The NVM sub-arrays share a support circuit.

In some embodiments the sub-arrays can be constructed, so that they exhibit different characteristics tailored to their intended use. For example one sub-array might be tailored for data retention, while the next sub-array for programming endurance, still another for write disturb immunity.

An advantage is offered over prior art architectures because it provides sub-arrays with reliability characteristics that are best suited for specific memory use models, while it provides savings of power and silicon real estate by sharing some of the support circuits.

These and other features and advantages of the invention will be better understood from the specification, which includes the following Detailed Description and accompanying Drawings.

BRIEF DESCRIPTION OF THE DRAWINGS

The following detailed description proceeds with reference to the accompanying drawings.

FIG. 3A is a conceptual block diagram illustrating components of memory cell #1 of FIG. 2 according to embodiments.

FIG. 3B is a conceptual block diagram illustrating components of memory cell #2 of FIG. 2 according to embodiments.

DETAILED DESCRIPTION

Integrated circuits are made according to embodiments, using semiconductor fabrication methods. A very high-level overview is now provided.

Figure 1A:
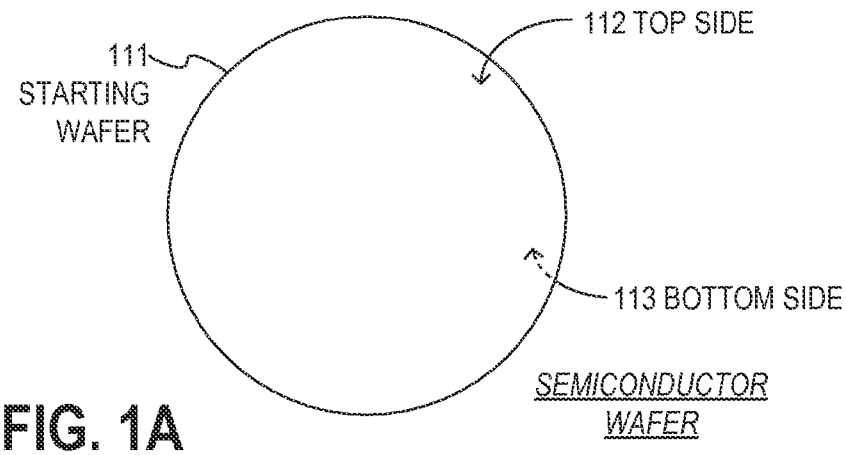
FIGS. 1A, 1B, and 1C are snapshots of steps in methods for preparing integrated circuit chips from a silicon wafer according to embodiments.

FIG. 1A shows starting wafer 111. Wafer 111 is typically made of semiconductor material, such as silicon. The silicon is sometimes doped with p-type or n-type impurities to improve its electronic properties, as desired for its operation as a substrate. Wafer 111 has a top side 112, and a bottom side 113 opposite to top side 112. Typically, circuits are formed on top side 112, as described below.

Figure 1B:
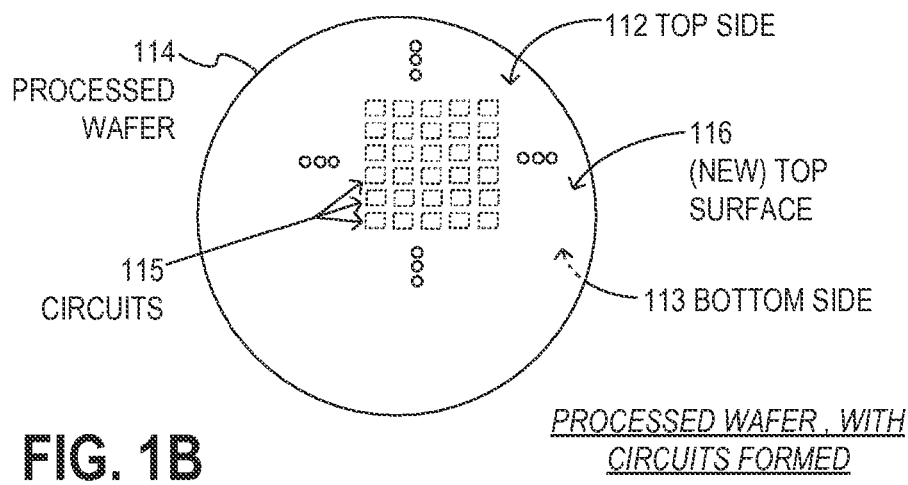

FIG. 1B shows a processed wafer 114, which has been derived from wafer 111 after circuits 115 have been formed according to embodiments. Only a few such circuits 115 are shown in FIG. 1B, but that is only by way of illustration. In actual practice, as many such circuits 115 are formed on wafer 111 as possible, to increase yield per wafer, and thus reduce the cost of each resulting unit.

Circuits 115 are formed by semiconductor manufacturing machines, often operated by foundries. It is worthwhile to note that circuits 115 are formed on the original surface of top side 112, both beneath the level of the original surface and above it. In addition, other materials are then deposited on top side 112. Accordingly, wafer 114 acquires a new top surface 116, which is elevated compared to the original surface.

Figure 1C:
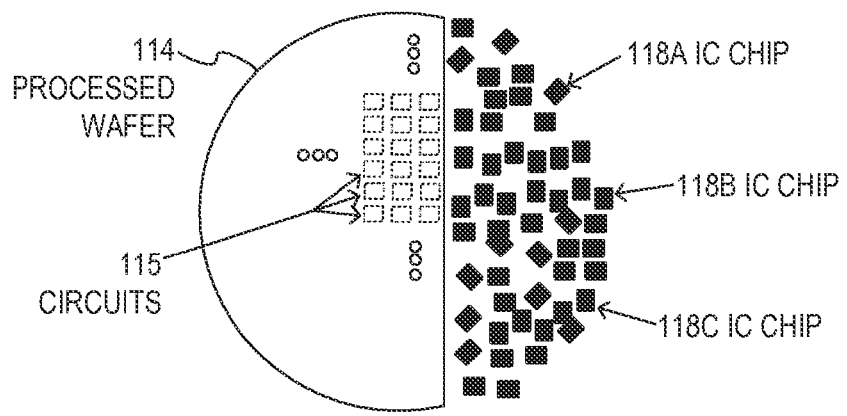

FIG. 1C shows that wafer 114 of FIG. 1B is separated afterwards into individual chips 118A, 118B, 118C, etc., according to embodiments. This separating is also called singulating. Singulation can be performed by dicing processed wafer 114, or etching it, etc. Each of individual chips 118A, 118B, 118C, typically contains one of circuits 115, and is thus called an integrated circuit (IC) chip. The size of each IC chip is thus determined in part by the size of circuit 115.

The present disclosure applies generally to an NVM architecture that employs multiple memory sub-arrays, each having a unique reliability attribute tailored for a specific use model. An example of an NVM employing multiple memory sub-arrays might be found in an embedded CMOS application. Such embedded CMOS applications include but are not limited to storing: serial numbers (i.e. chip tags), configuration information in ASICs (application specific integrated circuits), product, package and/or asset data in RFID) integrated circuits, analog trim information, digital trim information, and a host of other applications as will now be apparent to those skilled in the art.

NVM circuits store information by changing the physical attributes of a transistor or other circuit element in the NVM. In the case of floating-gate memories a quantity of electrons stored on an electrically isolated (floating) gate of a silicon FET (field effect transistor) are changed to store information. All NVM devices wear out, meaning that after a certain number of write/erase cycles the NVM memory will no longer meet its retention requirement (e.g., 10-years retention). In the case of floating-gate memories, wear out may occur because the process of moving electrons through the insulating oxide surrounding an electrically isolated gate eventually damages the insulating oxide.

Information is stored in a floating-gate type NVM by changing the amount of electrons that are stored on the floating gate. Adding or removing electrons from the floating gate results in a change in the threshold voltage associated with the device. To read data from the NVM memory cell, the channel current (or currents in the case of the differential NVM cell) associated with the device is measured. Depending on the quantity of electrons present on the floating gate the FET device will either be biased active (e.g., "on") or inactive (e.g., "off"). The measured channel current is interpreted as either a logical "1" or a logical "0" based on the relative on/off state of the floating-gate transistors.

Figure 2:
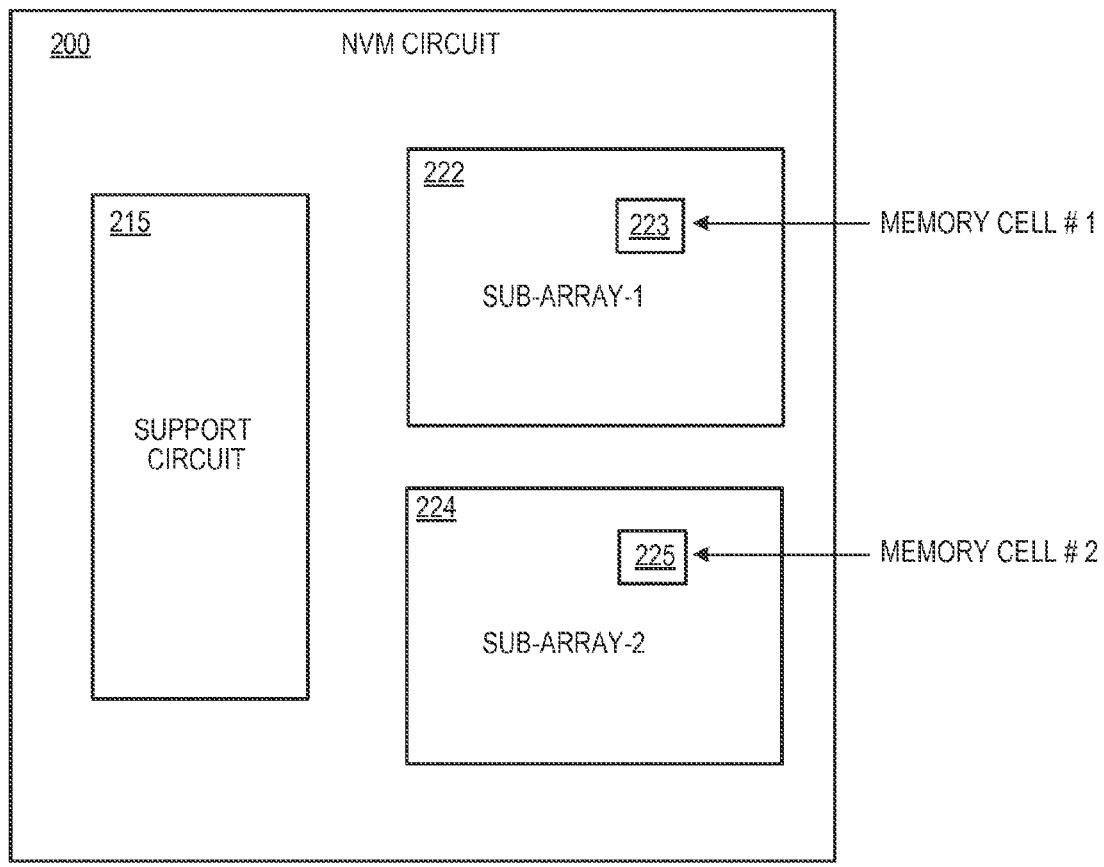
FIG. 2 is a block diagram illustrating an NVM circuit incorporating two memory sub-arrays with different cell types according to embodiments.

FIG. 2 is a simplified block diagram of an exemplary NVM circuit 200 that employs two memory sub-arrays. NVM circuit 200 includes memory sub-array-1 222, memory sub-array-2 224, and shared support circuit 215.

Memory sub-array-1 222 is constructed from memory cells #1 e.g. cells 223, while memory sub-array-2 224 is constructed from memory cells #2 e.g. cells 225 store electrical charges representing the digital data. Each sub-array comprising multiple cells that are addressable in terms of a row and a column. In some embodiments, the NVM memory cell may be constructed using floating-gate FETs.

Each one of the memory sub-arrays may have a unique reliability attribute tailored for a specific use model. One of the sub-arrays may exhibit superior performance for programming endurance, while another sub-array may have good data retention capability, still another one may be less susceptive to write disturb.

Memory cells 223, and 225, store electrical charges. An un-programmed memory cell typically has logic datum of "0". To store a logic "1", charges are stored onto a floating gate.

Shared support circuit 215 facilitates accessing individual cells during read and write operations, it also provides the necessary high-voltage, which is typically more than 12V, for placing onto, and removing charges from the floating gates.

FIG. 3A is simplified block diagram 323 that illustrates components of first memory cell 223 of FIG. 2 according to embodiments. First memory cell 223 includes first floating gate 353A, first programming transistor 352A, that puts charges onto the first floating gate 353A, and first read-out transistor 354A that reads an amount of charge stored on first floating gate 353A.

FIG. 3B is simplified block diagram 325 that illustrates components of second memory cell 225 of FIG. 2 according to embodiments. Second memory cell 225 includes second floating gate 353B, second programming transistor 352B, that puts charges onto second floating gate 353B, and second read-out transistor 354B, that reads an amount of charge stored on second floating gate 353B.

Figure 4:
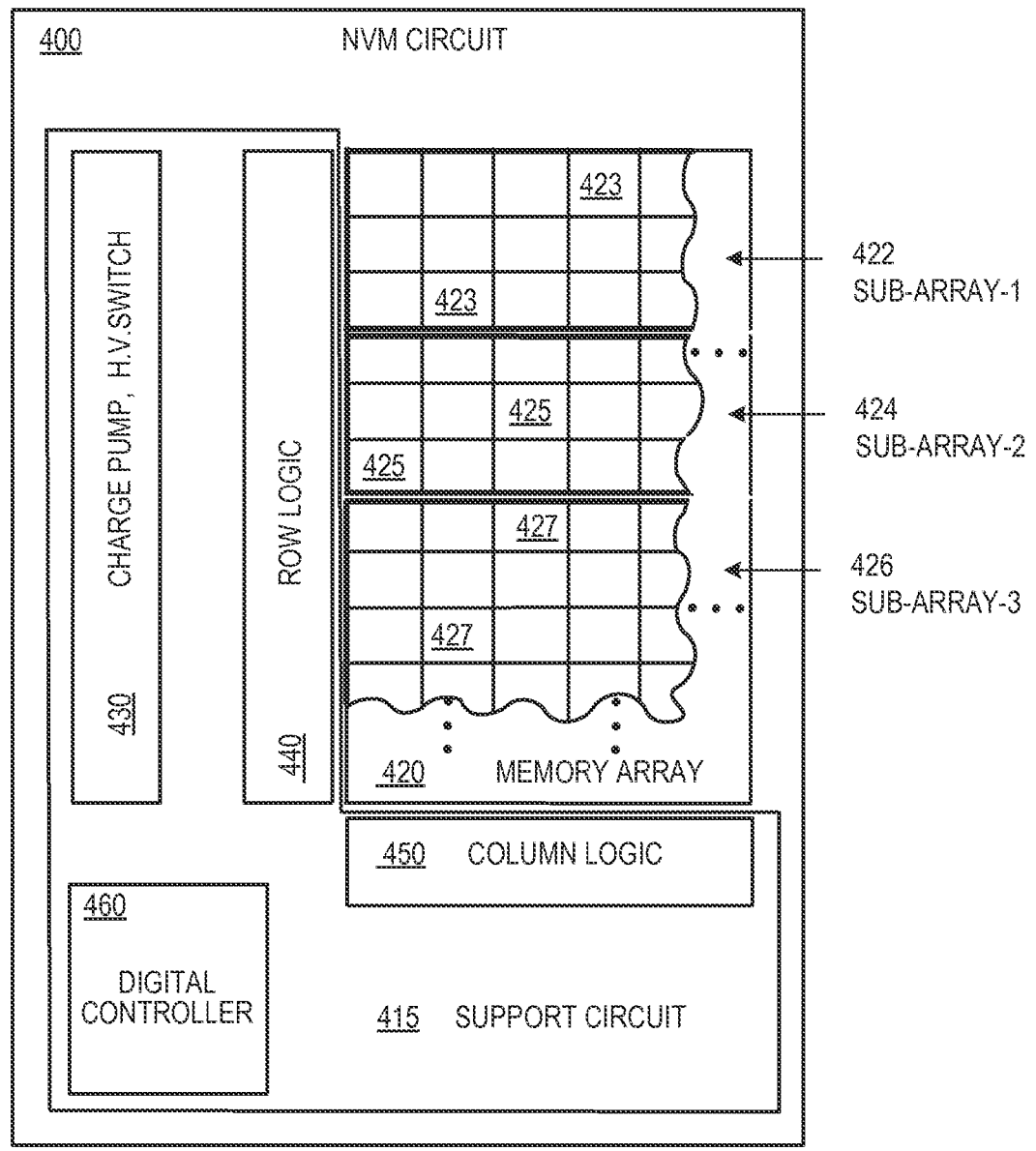
FIG. 4 is a block diagram illustrating an implementation of an NVM circuit incorporating multiple memory sub-arrays with different cell types for tailored reliability according to embodiments.

FIG. 4 is a block diagram of an example NVM circuit 400 that employs multiple memory sub-arrays. The example NVM circuit 400 includes memory array 420 and support circuit 415.

Memory array 420 may be implemented in the form of multiple memory sub-arrays 422, 424, and 426, each sub-array comprising cells that are addressable in terms of a row and a column.

Each one of the memory sub arrays constructed, as such, that they exhibit a unique reliability attribute tailored for a specific use model. One of the sub-arrays may exhibit superior performance for programming endurance, while another sub-array may have good data retention capability, still another one may be less susceptive to write disturb.

Memory sub-arrays 422, 424, and 426 commonly include a number of cells e.g. cells 423, 425, and 427, which store the data to be consumed by operational components. Memory cells 423, 425, and 426 store electrical charges that can represent digital data. An un-programmed memory cell has digital datum of "0", due to this fact, bits of "0"s need to be stored. To store a "1", charges are stored on a floating gate. This operation requires energy from the charge pump.

Support circuit 415 includes digital controller 460, charge pump/high-voltage circuit block 430, row logic 440, and column logic 450.

Digital controller 420 is arranged to provide the necessary data processing and control signal manipulation capability for write and read operations. It can address individual cells of memory array 420 during write (e.g. program) and read operation. It also manages the operation of charge pump/high-voltage switches 430 required for write/read operations.

Charge pump/high-voltage switch 430 is an electronic circuit that uses capacitors as energy storage elements to convert low voltages into higher voltage outputs. High voltages are needed for a tunneling operation that puts or removes charges from the floating gate of the memory cell during a write operation. Typical value for a high voltage is approximately 12 volts or 2.5×VCC.

Row logic 440 and column logic 450 circuits are responsible for selecting a specific cell of the memory array for read and write operation.

Sharing of support circuit 415, or part of the support circuit, by the different memory sub-arrays is an important design goal for a NVM circuit due to the silicon real estate cost. For example, in an RFID tag application the support circuit can occupy more than 50% of the NVM circuit area.

Figure 5:
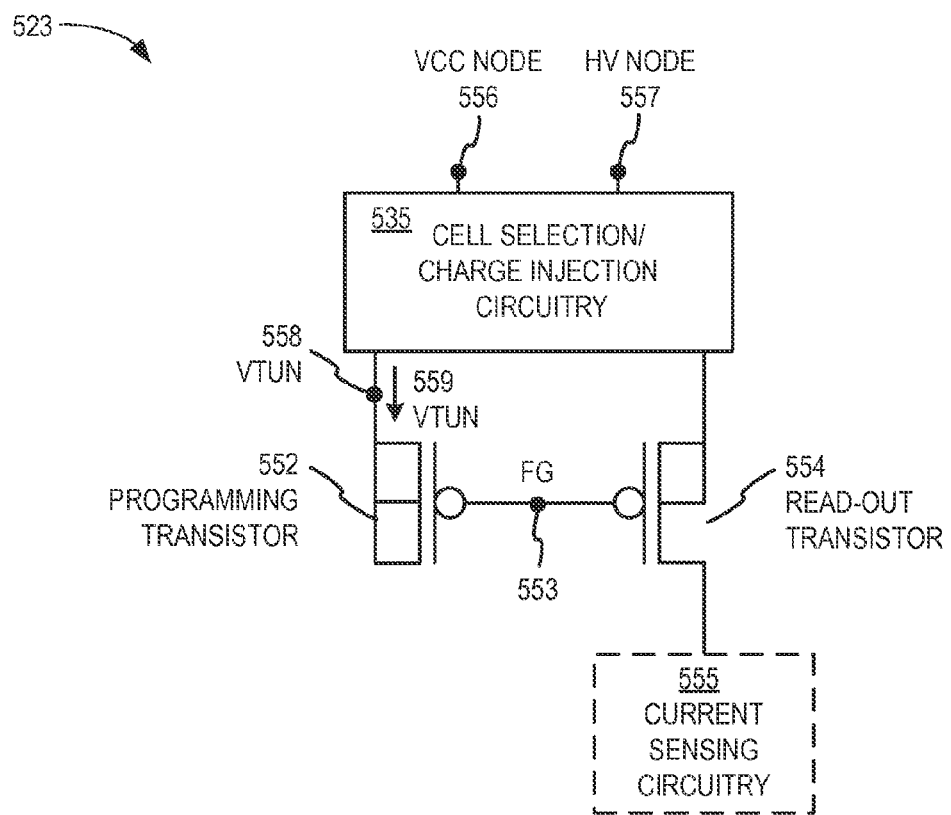
FIG. 5 is a block diagram illustrating a typical implementation of an NVM cell of FIG. 3A.

FIG. 5 is a simplified schematic diagram of a typical NVM memory cell 523 that employs pFET devices. Memory cell 523 operates as follows. During an erase operation, electrons are removed from a floating gate of the memory cell, thereby adjusting and lowering the switch point voltage of the memory cell. During a program operation, electrons are inserted onto the floating gate of the memory cell, thereby adjusting and raising the switch point voltage of the memory cell. Thus, during program and erase operations, the switch point voltages of a selected memory cell are changed. During a read operation, read voltages are applied to the selected memory cell. As a response, a current from these selected memory cells reflect a bit value based on the stored charges on their floating gate.

Memory cells may include charge injection circuit 535 that receives supply voltages from VCC node 556 and a high voltage from HV node 557. Charge injection circuit 535 is arranged to inject electrons to or remove electrons from the floating gate of the storage element employing mechanisms, such as, impact-ionized hot-electron injection, Fowler-Nordheim (FN) tunneling, channel hot-electron tunneling, or band-to-band, tunneling induced electron injection.

Memory cell 523 includes programming transistor 552, read-out transistor 554, and floating gate 553. Programming transistor 552 and read-out transistor 554 share floating gate 553. In one embodiment, read-out transistor 554 may be a pFET transistor with a drain, a source, a gate, and a well terminal. Drain and well terminals are coupled to charge injection circuit 535. Programming transistor 552 may include a FET device like, device 600A of FIG. 6A or device 600B of FIG. 6B with tunneling voltage applied to its source, drain, and body terminals. Read-out transistor 554 and programming transistor 552 share floating gate 553.

Floating gate 553 may include different regions doped with p- and n-type impurities. According to one embodiment, floating gate 553 is divided into three regions, a first region, a second region, and a third region, where the first region is implanted with impurities of p-type and located centrally within floating gate 553. The second region that is part of programming transistor 552 may be implanted with impurities of p- or n-type. The third region that is part of the read-out transistor is typically implanted with impurities of the same type as the first region.

Memory cell 523 may include at least one of a Metal-Oxide Field Effect Transistor (MOSFET), and a Metal-Semiconductor Field Effect Transistor (MESFET). Furthermore, the shared floating gate is adapted to be charged by at least one of impact-ionized hot-electron injection, Fowler-Nordheim (FN) tunneling, channel hot-electron tunneling, and band-to-band tunneling induced electron injection. The shared gate terminal may be discharged by FN tunneling.

A current sensing circuit 555 is coupled to a source of the read out device to determine a charge level on floating gate 553.

Figure 6A:
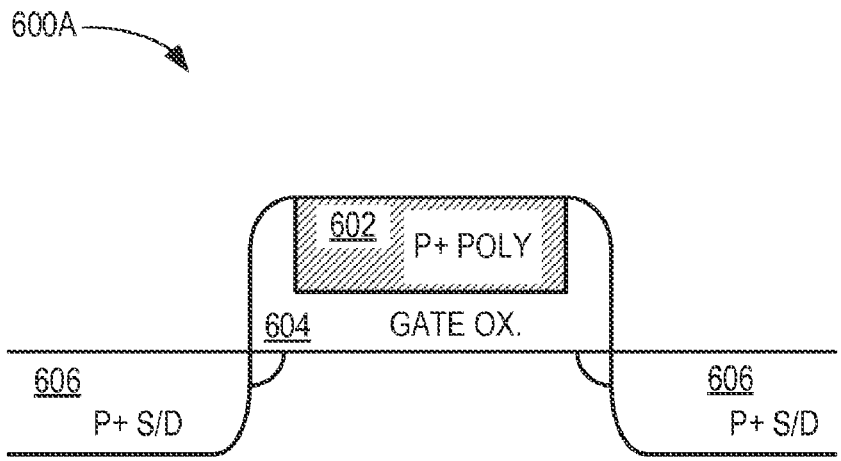
FIG. 6A is a cross-sectional view of a typical pFET transistor according to embodiments.
Figure 6B:
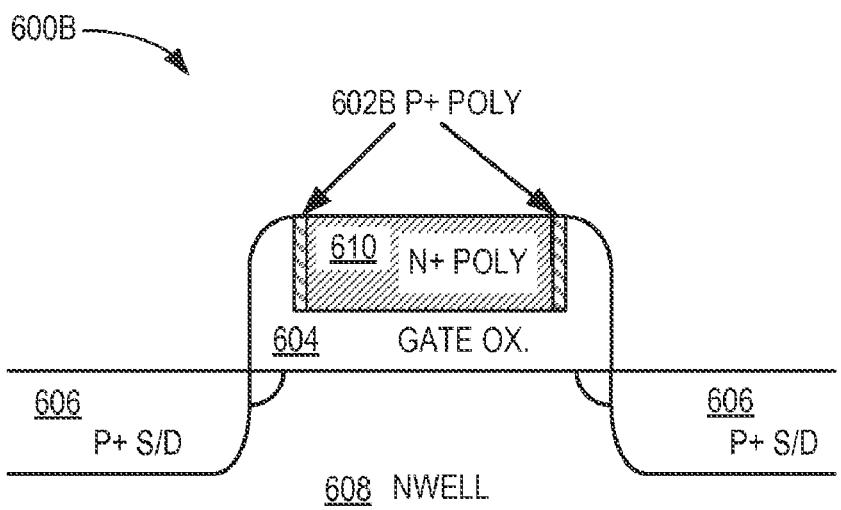
FIG. 6B is a cross-sectional view of a pFET transistor with an N+ poly gate according to embodiments.

FIGS. 6A and 6B are cross-sectional views of pFET transistor 600A and 600B respectively, used in memory cells 423, 425, and 427 of FIG. 4 according to embodiments.

FET devices that are used as read-out transistor 554 and programming transistor 552 of FIG. 5 may be formed in n-wells 608. Transistor 600A has P+ doped source/drain 606, and lightly doped drain (PLDD) implants 605. Gate Oxide 604 is disposed between a channel region of a transistor and poly gate 602. Poly gate 602 of the memory cell is formed from poly-silicon doped with impurities of P+ polarity.

According to other embodiments the FET device that is used as programming transistor 552 of FIG. 5 has a poly gate that is formed mostly from poly-silicon 610 doped with impurities of N+ polarity, however a periphery of the poly gate 602B is doped with impurities of P+ polarity. They are built in N-Well 526 with a dopant concentration of $10^{17}$ atoms/cm$^3$ and have a dopant concentration of approximately $10^{20}$ atoms/cm$^3$ for their source drain region.

In some implementations programming transistor 552 of FIG. 5 may be a double poly-Si floating gate transistor with a specific interpoly dielectric (IPD) thickness, and one of the second memory cells includes a second double poly-Si floating gate transistor having a second IPD thickness different from the first IPD thickness by at least 5%.

Figure 7:
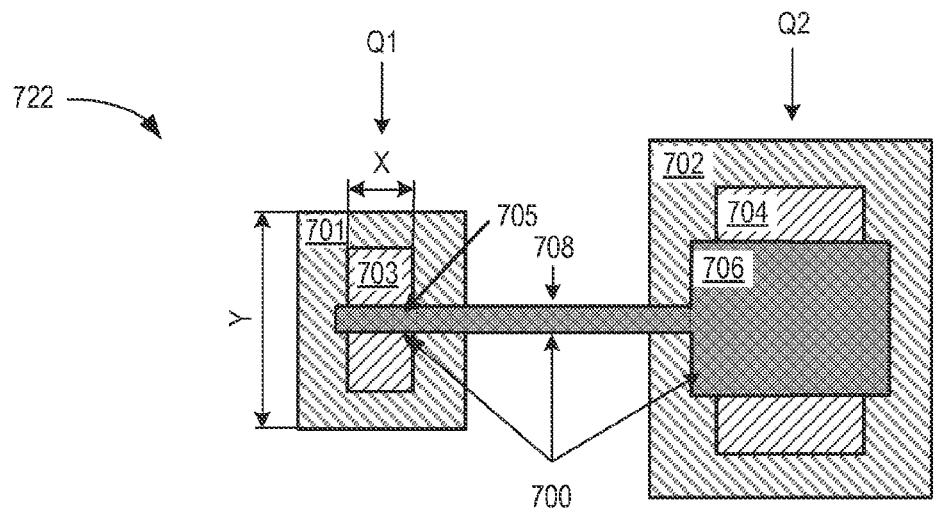
FIG. 7 is a sample layout of a regular NVM cell according to embodiments.

FIG. 7 is sample layout 722 of a regular NVM memory cell #1 according to embodiments. Memory cell #1 is constructed from pFET transistor Q1, and pFET transistor Q2, and floating gate 700. Floating gate 700 is shared by programming transistor Q1 and read-out transistor Q2.

Floating gate 700 may be divided into three regions. There is a first region 705 that is part of transistor Q1, second region 706 that is part of the transistor Q2 and third central region 708. In memory cell #1, all three regions of the floating gate 700 are doped with the same impurities P+ polarity.

Transistor Q1 is implemented in n-well 701 with a programming active area 703. Active area 703 is defined by height y and width x. Transistor Q2 is implemented in n-well 702 with a read-out active area 704. Typically, the read-out active area is at least twice as large as the programming active area. A coupling ratio can be defined as a quotient of the read-out active area over the programming active area.

Figure 8:
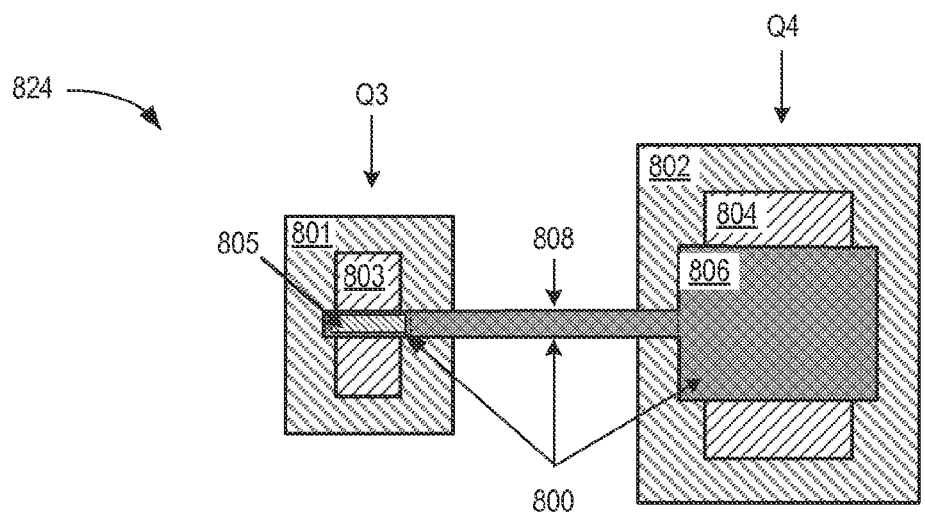
FIG. 8 is a sample layout of an NVM cell with N+ poly gate according to embodiments.

FIG. 8 is sample layout 824 of a regular NVM memory cell #2 according to embodiments. Memory cell #2 is different from memory cell #1 of FIG. 7 due to different doping polarities of transistors Q3 and Q1 respectively.

Memory cell #2 is constructed from pFET transistor Q3, and pFET transistor Q4, and floating gate 800. Floating gate 800 is shared by programming transistor Q3 and read-out transistor Q4.

Floating gate 800 may be divided into three regions. There is first region 805 that is part of transistor Q3, second region 806 that is part of the transistor Q4 and third region 808.

Regions 806 and 808 are doped with doped with impurities of P+ polarity, while region 805 is doped with impurities of N+ polarity.

pFET Q4 is implemented in n-well 801 with and programming active area 803. pFET Q2 is implemented in n-well 802 with read-out active area 804.

Figure 9:
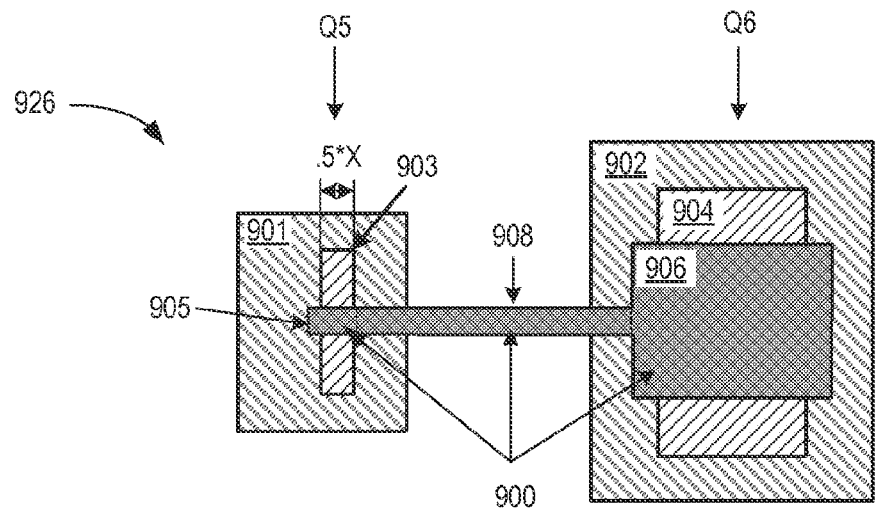
FIG. 9 is a sample layout of an NVM cell with a different coupling ratio than the NVM cell of FIG. 7 according to embodiments.

FIG. 9 is sample layout 926 of a NVM memory cell #3 with a different coupling ratio than cell #1 of FIG. 7 according to an embodiment.

Memory cell #3 is constructed from pFET Q5, and pFET Q6, and floating gate 900.

Floating gate 900 is shared by programming transistor Q5 and read-out transistor Q6. Floating gate 900 is doped with the same P+ type of impurities.

pFET Q5 is implemented in n-well 901 with programming active area 903. pFET Q6 is implemented in n-well 902 with read-out active area 904. Active area 903 is 50% of the active area 703 of FIG. 7, while the active area 904 is substantially the same as active area 704 of FIG. 7. With the chosen active are sizes the coupling ratio for cell #3 is approximately twice as large as the coupling ratio of cell #1.

Figure 10:
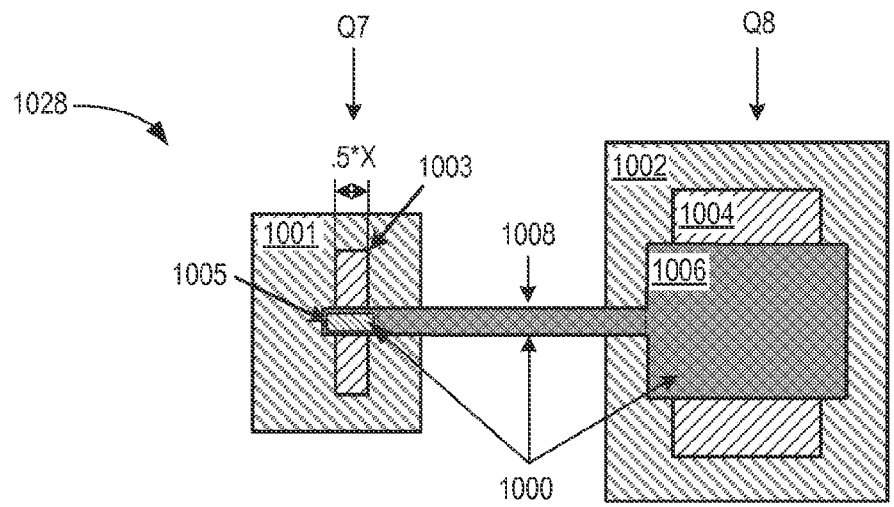
FIG. 10 is a sample layout of an NVM cell with N+ poly gate with different coupling ratio than the NVM cell of FIG. 8 according to embodiments.

FIG. 10 is sample layout 1028 of a NVM cell #4 with an N+ poly gate and a modified coupling ratio according to embodiments. Memory cell #4 is different from memory cell #1 of FIG. 7 due to different doping polarities of pFETs Q7 and pFET Q1 respectively, and different coupling ratios of cell #1 and cell #4.

Memory cell #4 is constructed from pFET Q7 and pFET Q8, and floating gate 1000. Floating gate 1000 is shared by programming transistor Q7 and read-out transistor Q8.

Floating gate 1000 is divided into three regions. There is a first region 1005 that is part of pFET Q7, second region 1006 that is part of the pFET Q8 and third central region 1008, Regions 1006 and 1008 are doped with impurities of P+ polarity, while region 1005 is doped with impurities of N+ polarity.

pFET Q7 is implemented in n-well 1001 with programming active area 1003. PFET Q2 is implemented in n-well 1002 with read-out active area 1004. Active area 1003 is 50% of the active area 703 of FIG. 7, while the active area 1004 is substantially the same as active area 704 of FIG. 7. With the chosen active are sizes the coupling ratio for cell #4 is approximately twice as large as the coupling ratio of cell #1.

In some implementations gate oxide thickness of the transistors can be made be different in NVM cell #1 versus NVM cell #2. The oxide thickness difference can be more than 50%.

In some other implementations that employ a double poly-Si floating gate transistor the IPD thickness of the transistors can be made be different in NVM cell #1 versus NVM cell #2. The IPD thickness difference can be more than 50%.

Figure 11:
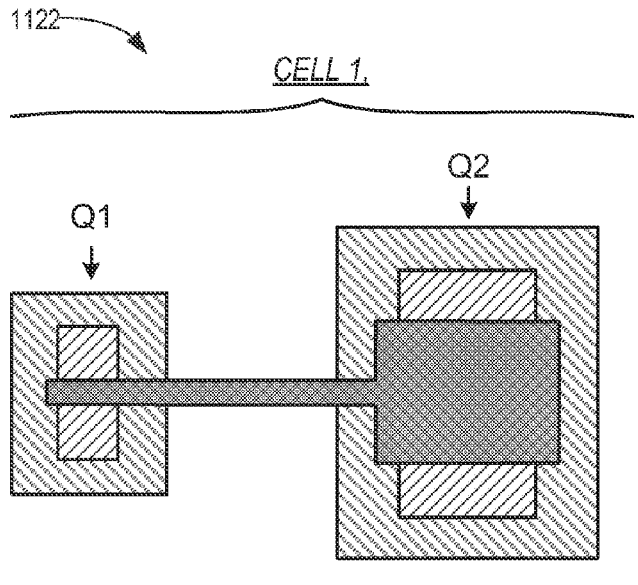
FIG. 11 is a sample layout of cell #1 of FIG. 7 highlighting specific characteristics of the cell according to embodiments.

FIG. 11 is annotated sample layout 1122 of cell #1 of FIG. 7 highlighting specific characteristics of the cell according to embodiments. In some application, NVM cell #1 may exhibit characteristics suggested by note 1102. It is the most difficult to program among the four cells (cell #1, #2, #3, and #4), while data retention and write disturb immunity are the best among the four cells.

In an RFID tag application, sub-array 422 of FIG. 4 constructed from cell #1 used for storing RFID data that not expected to be modified out after being turned over to users, i.e. an internal password and a TID serial number of the tag.

Figure 12:
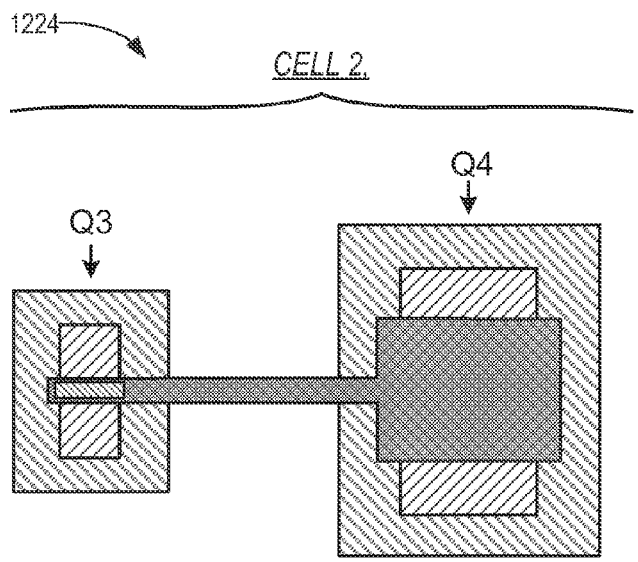
FIG. 12 is a sample layout of cell #2 of FIG. 8 highlighting specific characteristics of the cell according to embodiments.

FIG. 12 is annotated sample layout 1224 of cell #2 of FIG. 8 highlighting specific characteristics of the cell according to embodiments. In some applications, NVM cell #2 may exhibit characteristics suggested by note 1202. Cell #2 has the best programming endurance among the four cells, while its data retention and write disturb immunity are inferior to cell #1 and cell #3.

In an RFID tag application, sub-array 424 of FIG. 4 constructed from cell #2 used for storing RFID data that is expected to be read out frequently after being turned over to users. These are EPC data, and user data written by a user of the tag.

Figure 13:
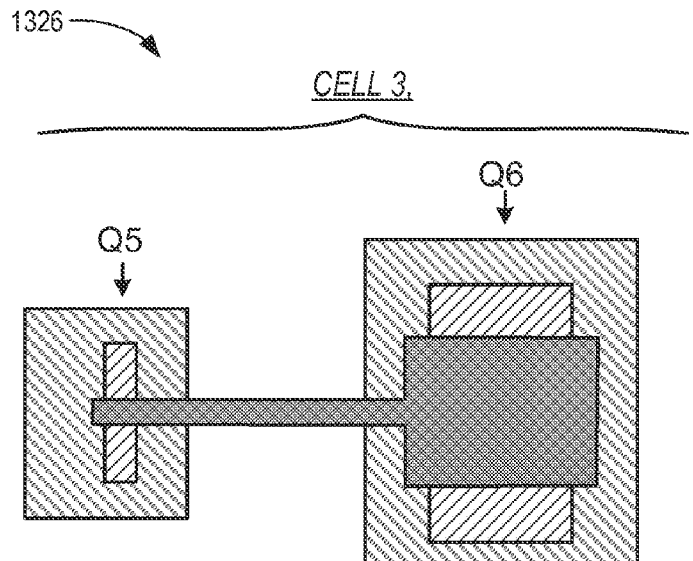
FIG. 13 is a sample layout of cell #3 of FIG. 9 highlighting specific characteristics of the cell according to embodiments.

FIG. 13 is annotated sample layout 1326 of cell #3 of FIG. 9 highlighting specific characteristics of the cell according to embodiments. NVM cell #3 in some applications exhibits suggested characteristics as shown by note 1302. Cell #3 has the second best data retention and write disturb immunity characteristics, and it is easier to program than cell #1.

In an RFID tag application, sub-array 426 of FIG. 4 constructed from cell #3 used for storing RFID data that is not expected to be modified out after being turned over to users, i.e. an access password and a kill password.

Figure 14:
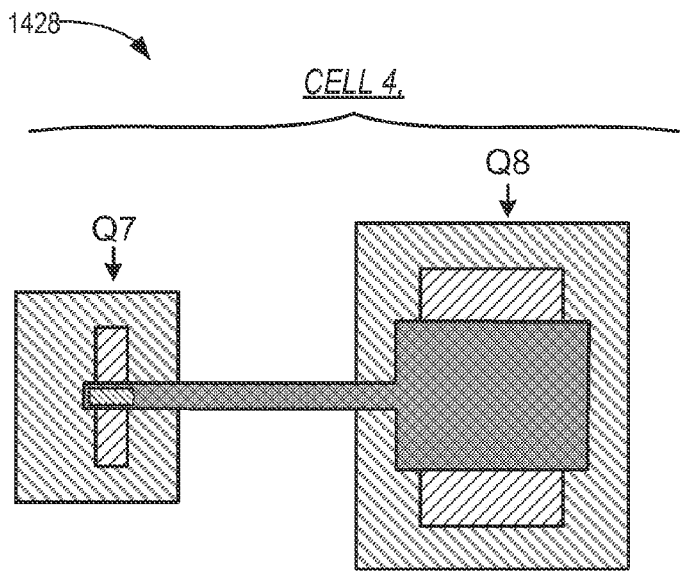
FIG. 14 is a sample layout of cell #4 of FIG. 10 highlighting specific characteristics of the cell according to embodiments.

FIG. 14 is annotated sample layout 1428 of cell #4 of FIG. 10 highlighting specific characteristics of the cell according to embodiments. NVM cell #4 in some applications exhibits suggested characteristics as shown by note 1402. Cell #4 has the second best programming endurance among the four cells, while its data retention and write disturb immunity are at par or are inferior to cell #1, cell #2 and cell #3.

In an RFID tag application, a sub-array constructed from cell #4 may be used for storing RFID data that is expected to be modified frequently after being turned over to users, i.e. user data written by a user of the tag.

Figure 15:
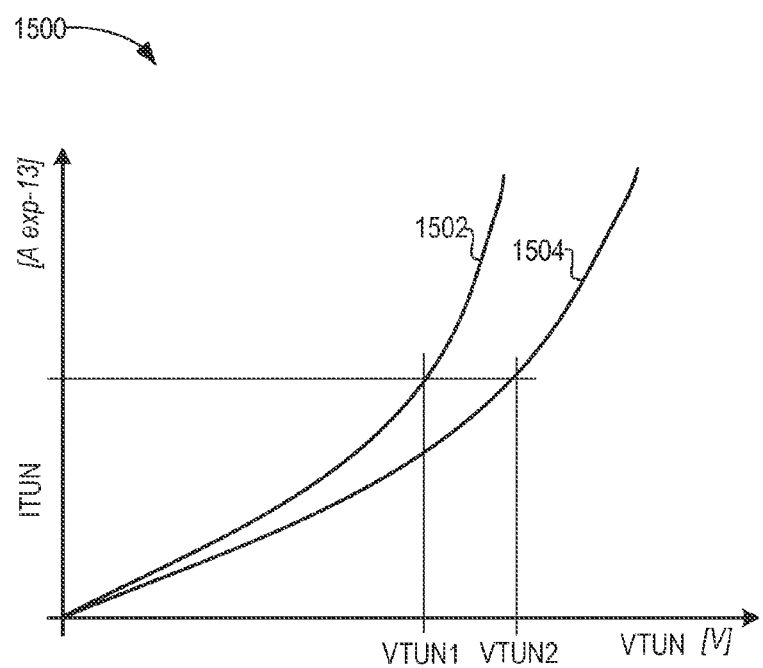
FIG. 15 is a diagram of an ITUN as a function of VTUN for programming transistors for NVM cells with different coupling ratios according to embodiments.

FIG. 15 is diagram 1500 that shows tunneling current ITUN 559 as a function of VTUN 558 of programming transistor 552 of FIG. 5 for NVM memory cells with different coupling ratios according to embodiments. Plot 1502 shows I/V function for a NVM cell with a first coupling ratio, while plot 1504 shows I/V function for a cell with a second coupling ratio that is smaller than the first coupling ratio. Diagram 1500 demonstrates that a NVM memory cell with higher coupling ratio provides tunneling current ITUN at lower tunneling voltage, VTUN1<VTUN2.

The electrical circuits described in this document can be manufactured in any number of ways, as will be appreciated by the persons skilled in the art. One such way is as integrated circuits, as described below.

Schematic-type inputs can be provided for the purpose of preparing one or more layouts, in accordance with embodiments. These inputs can include as little as a schematic of a circuit, to more including relative sizes of circuit components and the like, as will be appreciated by a person skilled in the art for such inputs. These inputs can be provided in any suitable way, such as merely in writing, or electronically, as computer files and the like. Some of these computer files can be prepared with the assistance of suitable design tools, often provided as computer software. Such tools often include instrumentalities for simulating circuit behaviors and the like.

These inputs can be provided to a person skilled in the art of preparing layouts. This is available, whether the person is within the same company, or another company, such as under a contract.

A layout in accordance with embodiments can be prepared that embodies the provided schematic-type inputs by the person skilled in the art in view of the present description. The layout itself is preferably prepared as a computer file. It may be additionally checked for errors, modified as needed, and so on.

The computer files above can be made from portions of computer files. For example, suitable individual designs can be assembled for the electrical components and circuits indicated in the schematic-type inputs. The individual designs can be generated anew, or selected from existing libraries for such items. In the layout phase, the assembled designs can be arranged to interoperate, so as to implement as integrated circuit(s) the electrical circuit(s) of the provided schematic-type inputs. These computer files can be stored in storage media, such as memories, whether portable or not, and the like.

Then a special type of computer file can be synthesized in accordance with embodiments from the prepared layout, in a manner that incorporates the prepared layout that has the embodied schematic-type inputs. Such files are known in the industry as IC chip design files or tapeout files, and express instructions for machinery as how to process a semiconductor wafer, so as to generate an integrated circuit that is arranged as in the incorporated layout. These IC chip design files or tapeout files can be stored on an article such as a memory device, in accordance with embodiments.

The synthesized tapeout file is then transferred to a semiconductor manufacturing plant, which is also known as a foundry, and so on. Transferring can be by any suitable means, such as over an electronic network. Alternatively, a tapeout file can be recorded in a storage medium, which in turn is physically shipped to the mask manufacturer.

The received tapeout file is then used by mask making machinery as instructions for processing a semiconductor wafer. The wafer, as thus processed, now has one or more integrated circuits, each made according to the layout incorporated in the tapeout file. If there is more than one circuit, then the wafer can be diced to separate them, and so on.

What is claimed is:

1. A non-volatile memory (NVM) circuit, the circuit comprising:
    a first NVM sub-array including first memory cells, each first memory cell having a first configuration that includes a first transistor with a gate oxide of a first thickness;
    a second NVM sub-array including second memory cells, each second memory cell having a second configuration that includes a second transistor with a gate oxide of a second thickness, the second thickness at least 50% thicker than the first thickness; and
    a support circuit connected to the first NVM sub-array and the second NVM sub-array for operating the first NVM sub-array and the second NVM sub-array.

2. The NVM circuit of claim 1, wherein the first configuration includes a first double poly-Si floating gate transistor with a first interpoly dielectric (IPD) thickness and the second configuration includes a second double poly-Si floating gate transistor with a second interpoly dielectric (IPD) thickness different from the first IPD thickness.

3. The NVM circuit of claim 2, wherein the second IPD thickness is at least 5% of the first IPD thickness.

4. The NVM circuit of claim 1, wherein the first configuration includes a first gate doped according to a first manner and the second configuration includes a second gate doped according to a second manner different from the first manner.

5. The NVM circuit of claim 4, wherein a polarity of the first gate is different from a polarity of the second gate.

6. The NVM circuit of claim 4, wherein the first gate is doped with impurities of P+ polarity and the second gate is doped with impurities of N+ polarity.

7. The NVM circuit of claim 1, wherein the first configuration includes a first active area and the second configuration includes a second active area corresponding to the first active area, the second active area different in size from the first active area.

8. The NVM circuit of claim 7, wherein the second active area is at least 50% larger than the first active area.

9. The NVM circuit of claim 1, wherein:
    the first configuration includes a first floating gate, a first programming transistor to program the first floating gate, and a first read-out transistor to read a charge stored on the first floating gate; and
    the second configuration includes a second floating gate, a second programming transistor to program the second floating gate, and a second read-out transistor to read a charge stored on the second floating gate.

10. The NVM circuit of claim 9, wherein the first programming transistor includes a first active area and the second programming transistor includes a second active area different in size from the first active area.

11. The NVM circuit of claim 9, wherein the first read-out transistor includes a first active area and the second read-out transistor includes a second active area different in size from the first active area.

12. The NVM circuit of claim 9, wherein the first floating gate includes a first region that is part of the first programming transistor and the second floating gate includes a second region that is part of second programming transistor, the first region doped in manner different from the second region.

13. The NVM circuit of claim 1, wherein the shared support circuit includes a high-voltage subsystem to generate a high voltage, larger than a supply voltage VCC, for programming the first memory cells and the second memory cells.

14. The NVM circuit of claim 1, wherein the shared support circuit includes at least one row logic for the first memory cells and at least one row logic for the second memory cells.

15. The NVM circuit of claim 1, wherein the shared support circuit includes at least one column logic for the first memory cells and at least one column logic for the second memory cells.

16. The NVM circuit of claim 1, wherein the circuit is included in a RFID tag.

17. An Integrated Circuit (IC) for a Radio Frequency Identification (RFID) tag, the IC comprising:
    a first non-volatile memory (NVM) sub-array including first memory cells, each first memory cell having a first configuration that includes a first transistor with a gate oxide of a first thickness;
    a second NVM sub-array including second memory cells, each second memory cell having a second configuration that includes a second transistor with a gate oxide of a second thickness, the second thickness at least 50% thicker than the first thickness; and
    a support circuit connected to the first NVM sub-array and the second NVM sub-array for operating the first NVM sub-array and the second NVM sub-array.

18. The IC of claim 17, wherein the first NVM sub-array stores a first type of RFID data and wherein the second NVM sub-array stores a second type of RFID data that is expected to be accessed more frequently than the first type of RFID data.

* * * * *